United States Patent [19]

Kane et al.

[11] Patent Number: 4,728,581

[45] Date of Patent: Mar. 1, 1988

[54] ELECTROLUMINESCENT DEVICE AND A METHOD OF MAKING SAME

[75] Inventors: James Kane, Lawrence Township, Mercer County; Mildred Ling, Bridgewater Township, Somerset County, both of N.J.

[73] Assignee: RCA Corporation, Princeton, N.J.

[21] Appl. No.: 918,553

[22] Filed: Oct. 14, 1986

[51] Int. Cl.[4] ........................ H05K 33/12; B32B 17/06

[52] U.S. Cl. .................................... 428/690; 428/691; 428/917; 313/503

[58] Field of Search .................. 427/34; 428/690, 691, 428/917; 313/503, 506

[56] References Cited

U.S. PATENT DOCUMENTS

| | | | |
|---|---|---|---|
| 2,900,271 | 8/1959 | MacIntyre et al. | 117/33.5 |
| 3,274,419 | 9/1966 | Roth | 313/108 |
| 3,480,818 | 11/1969 | Te Velde | 313/94 |
| 3,620,832 | 11/1971 | Te Velde | 117/210 |
| 3,894,164 | 7/1975 | Dismukes et al. | 427/70 |
| 3,949,146 | 4/1976 | Kane et al. | 428/432 |
| 4,020,389 | 4/1977 | Dickson et al. | 313/503 X |
| 4,163,920 | 8/1979 | Lambe et al. | 313/503 |
| 4,500,743 | 2/1985 | Hayashi et al. | 136/258 |
| 4,509,997 | 4/1985 | Cockayne et al. | 148/175 |
| 4,532,537 | 7/1985 | Kane | 357/30 |
| 4,608,308 | 8/1986 | Igarashi et al. | 313/503 X |

OTHER PUBLICATIONS

J. Dismukes et al., Proceedings of the Fourth International Conference on Chemical Vapor Deposition, pp. 275–286, Boston, Mass., Oct. 8–11, 1973.

Y. Shimizu et al., Conference Record of the 1985 International Display Research Conference, San Diego, CA, Oct. 15–17, 1985, pp. 101–105.

Y. Sano et al., Conference Record of the 1985 International Display Research Conference, San Diego, CA, Oct. 15–17, 1985, pp. 173–176.

B. Kazan, Displays, pp. 85–94, (Apr., 1985).

*Primary Examiner*—Nancy Swisher

*Attorney, Agent, or Firm*—E. M. Whitacre; L. L. Hallacher

[57] ABSTRACT

An electroluminescent device includes a tin oxide electrode having a textured surface with a phosphor layer interposed between dielectric layers overlying the textured surface. The textured surface propagates through the overlying layers so as to reduce the amount of generated light trapped in the device structure and increase the output brightness of the device.

16 Claims, 6 Drawing Figures

ELECTROLUMINESCENT DEVICE AND A METHOD OF MAKING SAME

The invention relates to an electroluminescent (EL) device and, more particularly, to such a device having improved light output and a method of making this device.

BACKGROUND OF THE INVENTION

An EL device typically comprises a light transmissive electrode, a first dielectric layer, overlying the electrode, a phosphor layer overlying the first dielectric layer, a second dielectric layer overlying the phosphor layer and a second electrode overlying the second dielectric layer. The applied electric field between the electrodes produces light emission through the light transmissive electrode at wavelengths characteristic of the phosphor material. If one or both electrodes are patterned to form picture elements an image can be displayed on such a device corresponding to a time-varying pattern of electrical voltages applied to the electrodes.

These devices are finding increased utility in applications such as data displays because they are compact and rugged and have comparatively low power consumption. However, the phosphor layer forms an optical waveguide which traps a portion of the generated light which is then reabsorbed or transferred to the periphery of the display. This effect reduces the display brightness. It would be desireable to have an electroluminescent device and a method of making same which reduced or eliminated this problem.

SUMMARY OF THE INVENTION

The invention is an improved EL device incorporating an electrode comprising a layer of electrically conductive tin oxide having a textured surface adjacent a first dielectric layer and an opposed surface which is smooth.

The invention is also a method of fabricating this EL device which includes the step of depositing the first electrode with a textured surface onto a substrate by chemical vapor deposition from an atmosphere containing tin, oxygen and hydrogen.

DETAILED DESCRIPTION OF THE PREFERRED EMBODIMENTS

Figure 1:
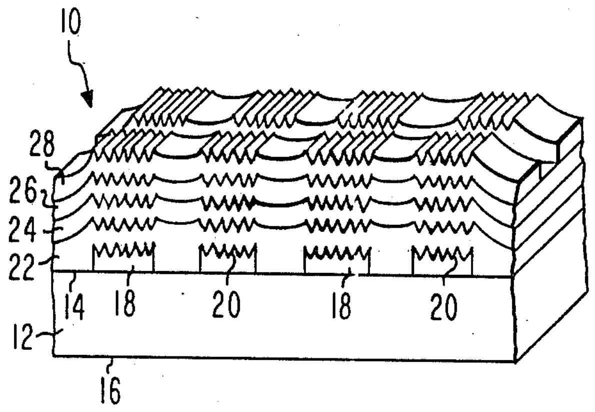
FIG. 1 is a cut-away plan view of an EL device of the invention.

In FIG. 1, an EL device 10 incorporating the principles of the invention includes a substrate 12 having first and second major surfaces 14 and 16 respectively. The first major surface 14 is planar or substantially flat. A first electrode 18 comprising a plurality of spaced apart sub-electrodes corresponding to the rows or columns of the device overlies the first major surface 14. The electrode 18 has a textured surface 20 opposed to the surface thereof adjacent to the first major surface 14. A first dielectric layer 22 overlies the first electrode 18 and the first major surface 14 between the sub-electrodes of the electrode 18. A phosphor layer 24 overlies the first dielectric layer 22 and a second dielectric layer 26 overlies the phosphor layer 24. A second electrode 28 overlies the second dielectric layer 26 and comprises a plurality of spaced-apart sub-electrodes oriented substantially orthogonal to the sub-electrodes of the first electrode 22 as is typical in an x-y addressing scheme. However, other angles between the sub-electrodes of the two electrodes may also be used.

The substrate 12 is typically composed of a substantially light transmissive material such as glass having a smooth, specularly reflecting surface. The substrate should have sufficient thickness to support the remainder of the structure.

The electrode 18 is typically substantially light transmissive over the wavelength range from about 400 to 700 nm, and has a randomly textured, non-specular surface which results in a milky white appearance of the substrate with the electrode thereon and is composed of electrically conductive tin oxide, typically doped with fluorine or antimony, with no loose particles. The electrode 18 has a textured surface with a minimum feature size of about 100 nanometers (nm), an average feature size between about 200 and 500 nanometers nm and a maximum feature size of about 800 nm. The degree of texture must be large enough to produce the desired optical de-trapping effect but not large enough to significantly reduce the breakdown voltage. By average feature size is meant the approximate vertical and lateral extent of the grains forming the textured surface. A grain may be composed of one or more crystallites. A particular grain may have a size greater or less than that described above but that a majority of the surface has a texture within the prescribed range. We have observed that the magnitude of the surface texture increases with increasing layer thickness. To obtain a useful surface texture the thickness of the light transmissive electrical contact should be greater than about 100 nm and is preferably less than about 1000 nm and is typically between about 250 and 500 nm.

The tin oxide layer may be deposited by chemical vapor deposition (CVD) onto the substrate heated to a temperature greater than about 350° C., typically to a temperature between about 450° C. and 550° C., from an atmosphere which includes tin, oxygen, hydrogen, and, typically, a suitable conductivity modifying dopant such as fluorine or antimony. The higher the temperature at which the deposition occurs, provided it is less than the temperature at which the substrate softens, the greater the texture. Chlorine, typically in the form of HCl, in the atmosphere is also useful as a transport agent for promoting the growth of the textured surface. The source of the tin may be a tin-halogen compound, preferably $SnCl_4$, or an organo-tin compound, such a n-butyl trichlorotin, dibutyl tin diacetate or tetramethy tin. Thin layers deposited by this process exhibit little texture or light scattering. For thicknesses greater than about 250 nm the surface texture and light scattering increase dramatically with increasing thickness. Layers which are deposited from an atmosphere containing tetramethyl tin in the absence of a halogen exhibit very little light scattering but become textured with the addition of a sufficient concentration of a halogen, such as chlorine, to the atmosphere from which the layer is deposited.

X-ray analysis shows that smooth layers and layers deposited using well known spraying techniques consist of grains of tetragonal cassiterite ($SnO_2$) having their c-axes oriented parallel to the substrate surface. For the textured layers of the invention, the grains also consist of tetragonal cassiterite but do not have the same degree of orientation to the substrate surface. Their c-axes are predominantly oriented at a non-zero angle to the substrate surface. A smooth tin oxide layer having thicknesses of about 500 nm had a crystallite size of about 325 nm. A sprayed layer of comparable thickness had a crystallite size of about 174 nm. A layer of comparable thickness deposited according to the CVD method described herein had a crystallite size of about 101 nm. Thus, layers having a smaller grain size exhibit a greater surface roughness. We believe that this is due to the lack of a preferred crystallographic orientation of the grains.

Figure 2:
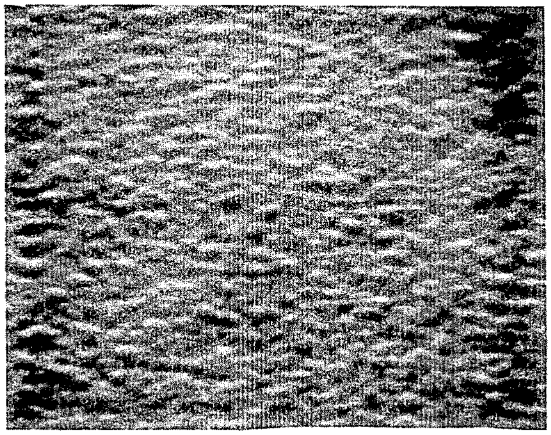
FIG. 2 is a scanning electron photomicrograph of a tin oxide surface which has been deposited by spraying techniques.
Figure 3:
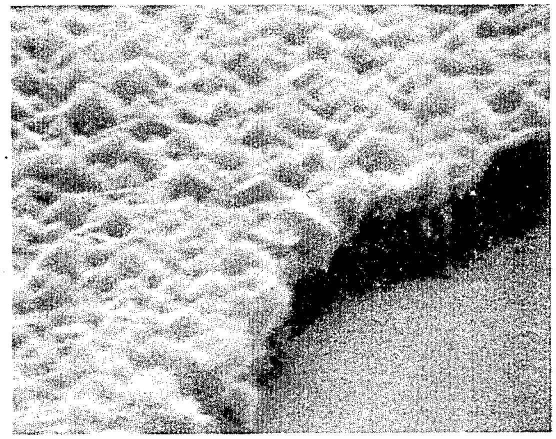
FIGS. 3 and 4 are scanning electron photomicrographs of textured tin oxide surfaces deposited according to the method of the invention.
Figure 4:
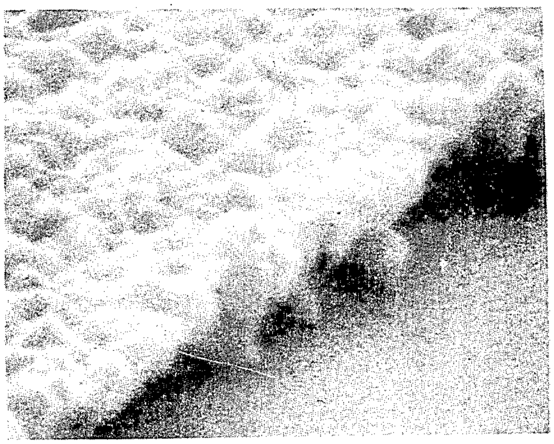

FIG. 2 is a scanning electron photomicrograph of a tin oxide layer deposited by spraying techniques. FIGS. 3 and 4 are scanning electron photomicrographs of tin oxide layers about 890 and 1200 nm thick, respectively, fabricated according to the method of the invention. FIG. 2 was made at 20,000 times magnification and a viewing angle of about 50° while FIGS. 3 and 4 were made at the same magnification but at a viewing angle of about 75°. The photomicrographs show the significantly enhanced texture of the tin oxide surface deposited by the CVD method of the invention. From these photomicrographs we estimate that the texture has a characteristic feature size value between about 200 and 500 nm.

The sub-electrodes of the first electrode 18 are defined photolithographically and etched with hydrochloric acid and zinc dust. After removal of the photoresist the substrate was given an additional rinse with hydrochloric acid to remove any residual elemental tin on the margins of the defined pattern. It is to be understood that the first electrode 18 may comprise one or more sub-electrodes.

The dielectrics layers, 22 and 26, may be composed of any substantially transparent, electrically insulating material having a high dielectric constant and breakdown voltage and are preferably composed of inorganic materials. The dielectric layers may be a composite of more than one layer. Suitable materials include aluminium oxide or silicon oxynitride deposited by sputtering or evaporation or yttrium oxide deposited at a temperature of about 450° C. by chemical vapor deposition (CVD) as disclosed, for example, by Dismukes et al. in the Proceedings of the Fourth International Conference on Chemical Vapor Deposition, Boston, Mass., Oct. 8–11, 1973, pages 275–286 (Electrochemical Society, Princeton, N.J.). The CVD process utilized the volatile chelate derived from dipivaloyl methane (2,2,6,6-tetramethyl-heptane-3,5-dione). The dielectric layers are typically between 200 and 500 nm thick. These layers, together with the phosphor layer 24, conformally coat the textured surface 20 and the surface 14 of the substrate 12 where exposed.

The phosphor layer 24 may be composed of any electroluminescent phosphor material having a suitable thickness. The phosphor layer 24 may be a composite of more than one layer. This layer is continuous with no voids, is typically between about 300 and 1000 nm thick and is typically polycrystalline. A useful phosphor material is ZnS:Mn deposited by electron beam evaporation techniques to a thickness of about 500 nm. Chemical vapor deposition and sputtering are other well known techniques for deposition of the phosphor layer.

The second electrode 28 may be composed of a light transmissive material such as tin oxide or indium tin oxide or a metal such as aluminum. The choice of material depends upon which electrode the emitted light passes through. The sub-electrodes may be formed after electrode deposition using standard photolithographic and etching techniques. Alternatively the photoresist pattern corresponding to the sub-electrode layout may be formed on the second dielectric layer 26, the second electrode 28 deposited and the sub-electrodes formed by lift-off techniques.

The device is completed using encapsulation techniques which are standard in the EL device art.

We have found that the dielectric layers 22 and 26 and the phosphor layer 24 conformally coat the underlying layer so that the texture of the first electrode 18 is propagated through the layers as illustrated in FIG. 1. Since the conventional thin film EL device structure consists of a stack of high index dielectric and phosphor layers, considerable loss of light occurs due to light piping within the device structure. The structure functions as a light guide and a substantial proportion of the generated light is trapped within this guide and is eventually absorbed and, thus, does not contribute to the observed luminance of the device. The fraction of emitted light has been estimated to be as low as 20% to 50% of the total generated light. The purpose of the textured tin oxide electrode is to disrupt the light guide structure and thus enable a larger proportion of the generated light to be emitted. The dimensions of the texture are chosen to produce the desired optical effect and yet not change the electrical breakdown characteristics of the device. We have found that the luminance is substantially higher using textured tin oxide as compared to the smooth tin oxide. This increase in brightness was achieved without any significant effect on the electrical breakdown characteristics of the devices.

In addition, because the different layers of the device are only of the order of several hundred of nanometers, variations in the layer thicknesses produce optical interference effects for the emitted light. The colorimetry of the device has an angular dependence so that there is an apparent shift in color where the device is viewed at different angles. This effect is particularly important for devices incorporating a ZnS:Mn phosphor since the emission is so broad. Any non-uniformity in the thicknesses across the device also produces a change in the color of the portion of the emitted light. We believe that these interference effects will be significantly reduced because the texture of the tin oxide electrode will destroy the coherence of the filter.

EXAMPLE

Four EL devices were prepared using 7.6 cm square Type 7059 glass plates of the Corning Glass Works, Inc., Corning, N.Y. having smooth, specularly reflecting surfaces. Two plates were prepared with a smooth tin oxide electrode by a CVD process using the oxidation of tetramethyl tin. Two plates were prepared with the textured tin oxide coating of the invention by hydrolysis of tin tetrachloride at 450° C. in simple hot plate CVD reactor as described above. Tin tetrachloride vapor was transported into the reactor in a stream of inert gas from a temperature controlled bubbler. Water vapor was also introduced in an inert gas stream from a temperature controlled source at about 23° C.

After the sub-electrode pattern was defined and etched as described above, a yttrium oxide dielectric layer was deposited on each plate using the process described above. A first pair of devices, (Group I) comprising one plate with a smooth tin oxide electrode and one plate with a textured tin oxide electrode, was coated with about 300 nm of yttrium oxide as described above. A second pair of devices (Group II), again comprising one smooth and one textured tin oxide electrode on glass plates, was coated with about 500 nm of yttrium oxide. An about 500 nm thick manganese doped zinc sulphide phosphor layer was then deposited on all four plates by electron beam evaporation. Each plate was then coated with a second yttrium oxide dielectric layer about 200 nm thick. An evaporated aluminium second electrode pattern orthogonal to the tin oxide first electrode pattern was formed on all four plates.

Figure 5:
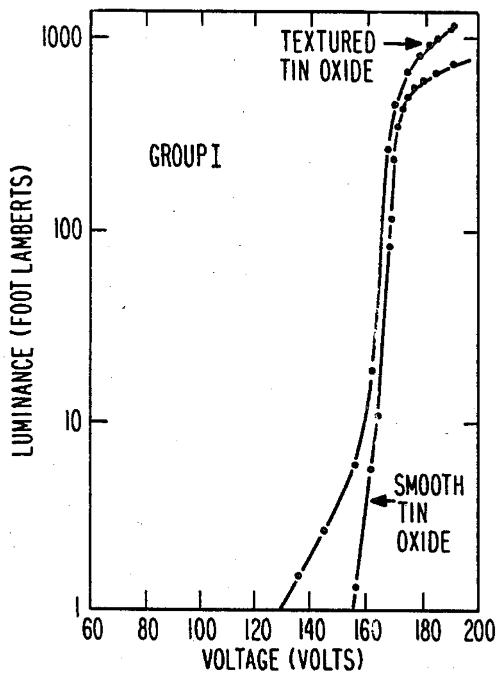
FIGS. 5 and 6 are graphical illustrations of the output brightness versus applied voltage for EL devices embodying the invention and comparative prior art devices.
Figure 6:
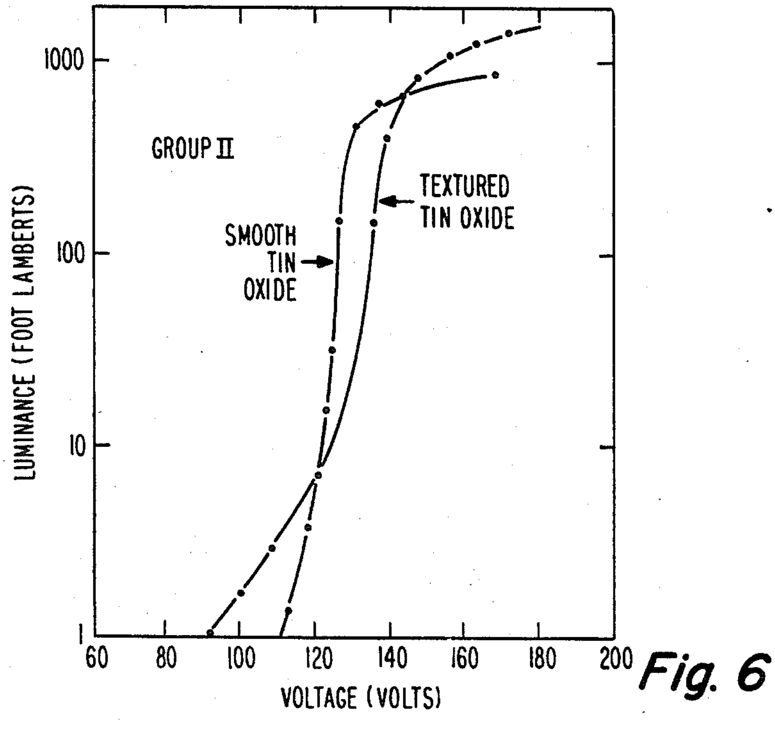

In FIGS. 5 and 6 the luminance as a function of applied voltage for the devices of Groups I and II, respectively, are shown. The luminance is about fifty percent higher for the device having the textured tin oxide electrode as compared to the device having the smooth tin oxide electrode for each group. This increase in brightness was achieved without any significant effect on the electrical breakdown characteristics of the devices.

We claim:

1. In an electroluminescent device comprising a first electrode, a first dielectric layer overlying the first electrode, a continuous phosphor layer overlying the first dielectric layer, a second dielectric layer overlying the phosphor layer and a second electrode overlying the second dielectric layer, the improvement comprising: said first electrode comprising tin oxide having a textured surface adjacent the first dielectric layer and an opposed surface which is smooth and said phosphor layer conformally overlying said textured surface.

2. The device of claim 1 wherein the first electrode overlies a smooth, specularly reflecting surface of a substrate with the smooth surfaces of the substrate and the first electrode adjacent one another.

3. The device of claim 2 wherein the substrate and the first electrode are light transmissive.

4. The device of claim 3 wherein said first electrode comprises a plurality of sub-electrodes spaced apart from one another on the surface of the substrate.

5. The device of claim 1 wherein said first electrode has a minimum thickness of about 100 nanometers and said textured surface has a minimum feature size of about 100 nanometers.

6. The device of claim 5 wherein said textured surface has a feature size between about 100 and 800 nanometers.

7. The device of claim 6 wherein said textured surface has a feature size between about 200 and 500 nanometers.

8. In an electroluminescent device comprising a substrate having a smooth, specularly reflecting surface with a first electrode overlying said substrate surface and a continuous phosphor layer overlying said first electrode; the improvement comprising:

said first electrode comprising tin oxide having a surface opposed to the surface thereof adjacent to said substrate surface which is extended and said phosphor layer conformally overlying said textured surface.

9. The device of claim 8 wherein said first electrode has a minimum thickness of about 100 nanometers and said textured surface has a minimum feature size of about 100 nanometers.

10. The device of claim 9 wherein said textured surface has a feature size between about 100 and 800 nanometers.

11. The device of claim 10 wherein said textured surface has a feature size between about 200 and 500 nanometers.

12. In a method of forming an electroluminescent device comprising the steps of forming a first electrode on a smooth, specularly reflecting surface of a substrate, forming a first dielectric layer overlying said first electrode, forming a phosphor layer overlying said first dielectric layer, forming a second dielectric layer overlying said phosphor layer and forming a second electrode overlying said second dielectic layer; the improvement comprising:

depositing a tin oxide first electrode onto said substrate surface held at a temperature greater than about 350° C. by chemical vapor deposition from an atmosphere containing tin, oxygen, hydrogen and a conductivity modifying dopant whereby the surface of said electrode opposed to said substrate surface has a dominant peak-to-valley texture greater than 100 nanometers; and wherein said tin oxide first electrode has a textured surface adjacent the first dielective layer and an opposed surface which is smooth.

13. The method of claim 12 wherein said atmosphere further comprises a halogen.

14. The method of claim 13 wherein said halogen is chlorine.

15. The method of claim 12 wherein said first electrode is deposited to a thickness between about 100 and 1000 nanometers.

16. The method of claim 15 wherein the peak-to-valley texture of said first electrode surface is between about 250 and 500 nanometers.

* * * * *